(12) United States Patent
Choi et al.

(10) Patent No.: US 6,198,326 B1
(45) Date of Patent: Mar. 6, 2001

(54) DELAY TIME COMPENSATION CIRCUIT FOR CLOCK BUFFER

(75) Inventors: Joong-Ho Choi; Boo Yong Park, both of Seoul; Jin-Hong Ahn, Kyungki-Do, all of (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/191,345

(22) Filed: Nov. 13, 1998

(30) Foreign Application Priority Data

Nov. 13, 1997 (KR) .................................. 97/59641

(51) Int. Cl.[7] .................................................. H03H 11/26
(52) U.S. Cl. ........................... 327/263; 264/268; 264/277
(58) Field of Search .................................. 327/263, 264, 327/268, 277, 201, 218, 281

(56) References Cited

U.S. PATENT DOCUMENTS 4,922,141 * 5/1990 Lofgren ................................. 307/595
5,818,270 * 10/1998 Hamza ................................. 327/116

OTHER PUBLICATIONS

Toshio Yamada et al., 1996 Symposium on VLSI Circuits Digest of Technical Papers, pp. 112–113.

* cited by examiner

Primary Examiner—Margaret R. Wambach
Assistant Examiner—Cassandra Cox

(57) ABSTRACT

A delay time compensation circuit for a clock buffer includes first and second toggle flip-flops multiplying an input clock signal and a delay clock signal which is delayed by an input buffer, respectively, a time interval extraction chain extracting a time interval between a rising edge of the input clock signal and a rising edge of the delay clock signal in accordance with clock signals multiplied in the first and second toggle flip-flops, and a variable delay chain delaying the input clock signal by a time interval extracted from the time interval extraction chain. The circuit employs a ½ multiplied clock signal and operates without regard to a duty cycle of an input clock signal, thereby compensating for all the delay time within the cycle of the input clock signal.

17 Claims, 6 Drawing Sheets

DELAY TIME COMPENSATION CIRCUIT FOR CLOCK BUFFER

BACKGROUND OF THE INVENTION

1. Field of the Invention

The present invention relates to a delay time compensation circuit, and more particularly to an improved delay time compensation circuit for a clock buffer which makes it possible to effectively compensate for the time delayed by a clock buffer.

2. Description of the Background Art

In general, a signal input terminal and a signal output terminal in a synchronous system become synchronized and activated based on an edge of an input clock signal. The input clock is required to pass through a clock buffer to drive an overloaded capacitance load in an internal system. Thus, the clock signal internally employed in a system and the clock signal at the output of that same system have a time delay in comparison to an input clock signal. Also, the faster becomes an operation speed of the synchronous system, the more difficult the synchronization due to the gradual increase of the time delay.

Conventional circuits have been designed in an attempt to obtain an output clock signal which is synchronized with an input clock signal by compensating for a delay time of the input clock signal caused by the clock buffer. For instance, conventional circuits include a phase-locked loop (PLL) circuit or a delay-locked loop (DLL) circuit which employs a feedback technique, and a negative-delay circuit (NDC) or a synchronous mirror delay (SMD) circuit which does not employ a feedback technique. The above-mentioned circuits are designed to internally generate clock signals that are ahead of the input clock signal by an amount of time that corresponds to the delay time introduced by the clock buffer, thus compensating for the delay time caused by the clock buffer in order to generate output clock signals which are synchronized to input clock signals.

FIG. 1 is a block diagram illustrating a DLL circuit which adopts such a feedback technique.

As shown therein, an input buffer FB1 has a delay time $t_{B1}$, and an output buffer FB2 has a delay time $t_{B2}$. The DLL circuit is designed to compensate for the respective delay times $t_{B1}$, $t_{B2}$ in accordance with the respective input and output buffers FB1, FB2. The DLL circuit includes a delay device VB having a variable delay time $t_D$, a feedback delay device FB3 having a fixed delay time $t_F$, and a phase detector 10.

Initially, an input clock signal ICLK (FIG. 3A) passes through the input buffer FB1 and is changed, after a period of $t_{B1}$, into a clock signal RCLK (FIG. 3B). The phase detector 10 then compares respective phases of the clock signal RCLK and the clock signal FCLK (FIG. 3E), which is fed back, thereby generating a control signal CS which corresponds to the difference compared.

Next, the variable delay device VB delays the clock signal RCLK by the delay time $t_D$, which is determined based on the control signal CS, thereby generating a clock signal DCLK (FIG. 3C). The clock signal DCLK becomes delayed in the output buffer FB2 by a time period of $t_{B2}$, such that a final output clock signal OCLK is synchronized with the input clock signal ICLK, as shown in FIG. 3D.

The final output clock signal OCLK passes through the feedback delay device FB3 and becomes, after a time period of $t_F$, the feedback clock signal FCLK (FIG. 3E).

The above-mentioned feedback circuit satisfies the following expression:

$$T_{CLK}=t_D+t_{B2}+t_F.$$

Accordingly, the clock signals RCLK, FCLK become identical to each other in phase, and the output clock signal OCLK becomes synchronized with the input clock signal ICLK.

However, when the DLL circuit is employed, the delay device VB is initially set to an initial synchronous setting time that is proportional to a square value of a clock cycle $T_{CLK}$, thereby elongating a delay time disadvantageously.

Also, in order to decrease power consumption, delay correction is suspended when an input clock signal ICLK is briefly interrupted in a standby state and started anew when a clock signal is restored to a normal state in which a clock signal is required. Thus, when a difference between the output clock signal and the input clock signal is significant, the amount of time required to achieve restoration from standby state to normal state is increased. In addition, there occurs a jittering phenomenon in which an edge start point of the output clock signal becomes changed.

The above disadvantage is attributable to the feedback technique applied to the DLL circuit. To avoid these disadvantages a circuit may be designed with an NDC which does not rely on a feedback to compensate for the delay times $t_{B1}$, $t_{B2}$ associated with the clock buffers FB1, FB2. Such a circuit is shown by FIG. 2.

That is, when an input clock signal ICLK (FIG. 4A) and a delay clock signal DCLK (FIG. 4B) are applied to NDC 20, a difference ($T_{CLK}\backslash 2-T_{DEL}$) is obtained between a half cycle $T_{CLK}\backslash 2$ of the input clock ICLK and the delay time $t_{DEL}$ of the input buffer corresponding to the respective rising edges of the two clock signals. NDC 20 generates a clock signal NCLK (FIG. 4C) by delaying the falling edge of input clock signal ICLK by a timed delay equivalent to the difference ($T_{CLK}\backslash 2-t_{DEL}$), which difference represents the difference between the falling edge t1 of the input clock signal ICLK and the rising edge of the delay clock signal DCLK. Thus, the rising edge of the clock signal NCLK leads the rising edge of the input clock signal ICLK by a time period of $t_{DEL}$, and an output clock signal OCLK (FIG. 4D) can be synchronized with the input clock signal ICLK after one period.

However, when using the NDC 20, data corresponding to both the rising and falling edges of an input clock signal ICLK is required. That is, the delay time $t_{DEL}$ corresponding to the input buffer FB1 is evaluated at a time point t1 which corresponds to the midpoint of input clock signal ICLK ($T_{CLK}\backslash 2$) or the falling edge of the input clock signal ICLK. Therefore, the rising edge of the output signal NCLK is generated after a time period ($T_{CLK}\backslash 2-t_{DEL}$) from the time point t1. Also, because the half cycle value is used, the input clock signal ICLK must keep a precise duty cycle of 50% in addition to the rising edge.

The delay time $t_{DEL}$ in the clock buffer FB1 may be compensated using the above method when:

$$T_{CLK}/2-N\times \text{Tstage} \leq t_{DEL} \leq T_{CLK}/2 \tag{1},$$

where Tstage denotes a delay time for a unit delay device within NDC 20, and N denotes the number of unit delay devices within NDC 20.

If an entire delay time (N×Tstage) for a delay device chain that is composed of the unit delay devices of NDC 20 remains within the half cycle ($T_{CLK}/2$), the expression (1) may be changed as follows:

$$0 \leq t_{DEL} \leq T_{CLK}/2 \tag{2}.$$

From this expression, it should be understood that the delay time $t_{DEL}$ of the clock buffer must be less than a half cycle of the input clock signal ICLK to be compensated with the above-described system.

Therefore, if a magnitude of the clock buffer must be increased to activate a large capacitance load, the delay time of the clock buffer may not satisfy expression (2), rendering the above-described system incapable of computing for the delay time using NDC 20.

Also, since the pulse width of the output clock signal OCLK corresponds to the delay time $t_{DEL}$ of the clock buffer, the pulse width becomes variable in proportion to the variation of the delay time $t_{DEL}$.

SUMMARY OF THE INVENTION

It is an object of the present invention to provide a delay time compensation circuit for a clock buffer capable of compensating for a delay time caused by a clock buffer by use of a time interval extraction chain and a variable delay time chain.

To achieve the above and other objects, there is provided a delay time compensation circuit for a clock buffer which includes first and second toggle flip-flops multiplying an input clock signal and a delay clock signal which is delayed by an input buffer, respectively, a time interval extraction chain extracting a time interval between a rising edge of the input clock signal and a rising edge of the delay clock signal, in accordance with clock signals multiplied in the first and second toggle flip-flops, and a variable delay chain delaying the input clock signal by a time interval extracted from the time interval extraction chain.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become better understood with reference to the accompanying drawings, which are given only by way of illustration and thus are not limitative of the present invention, wherein.

DETAILED DESCRIPTION OF THE PREFERRED EMBODIMENT

Further scope of applicability of the present invention will become apparent from the detailed description given hereinafter. However, it should be understood that the detailed description and specific examples, while indicating preferred embodiments of the invention, are given by way of example only, since various changes and modifications within the spirit and scope of the invention will become apparent to those skilled in the art from this detailed description.

Figure 1:
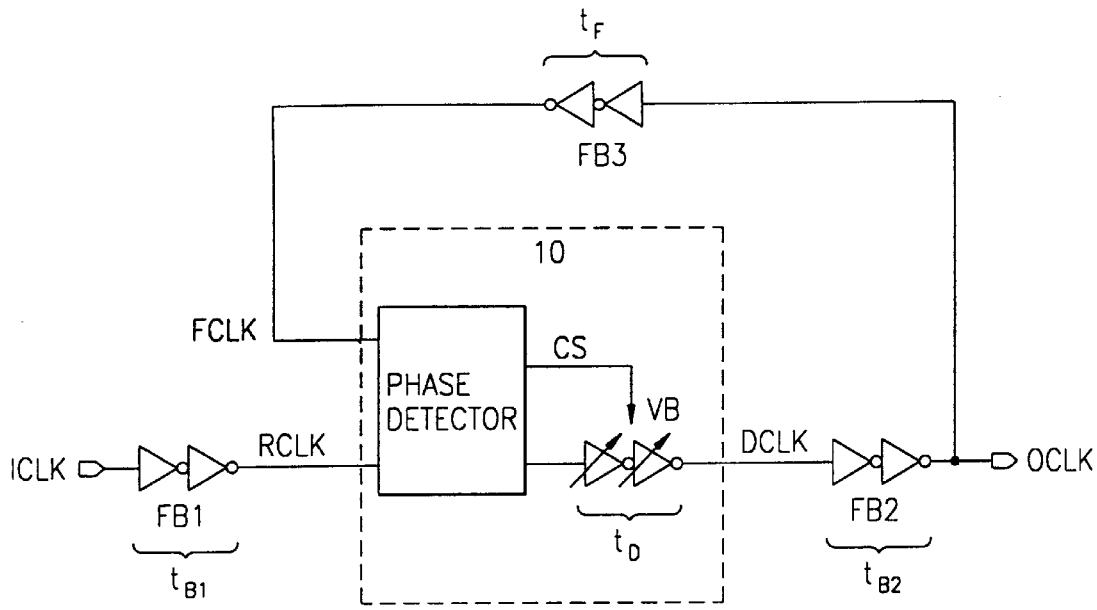
FIG. 1 is a block circuit diagram illustrating a conventional DLL circuit.
Figure 2:
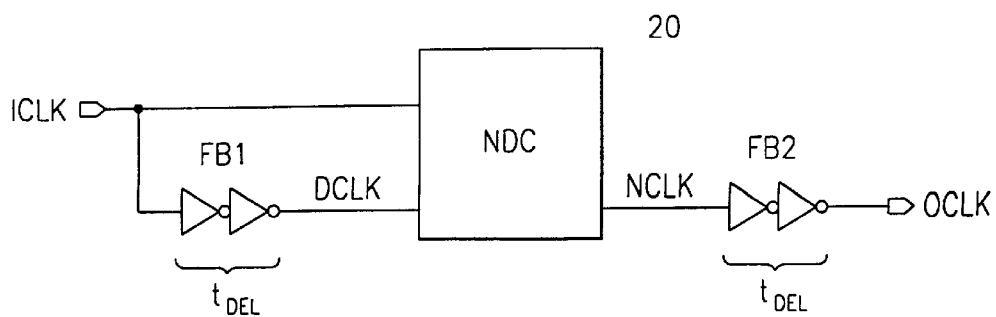
FIG. 2 is a block circuit diagram illustrating conventional NDC structure.
Figure 3A:
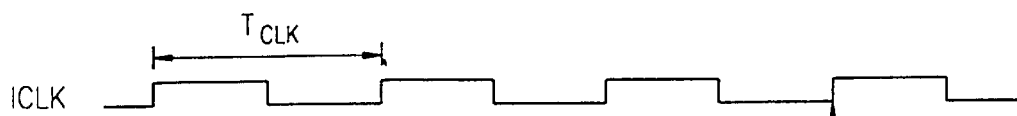
FIGS. 3A through 3E are timing diagrams of respective signals in the circuit of FIG. 1.
Figure 3B:
Figure 3C:
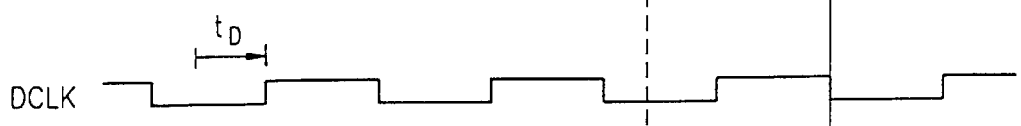
Figure 3D:
Figure 3E:
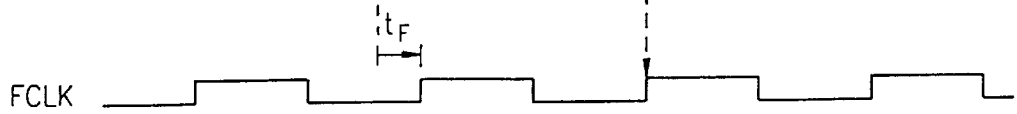
Figure 4A:
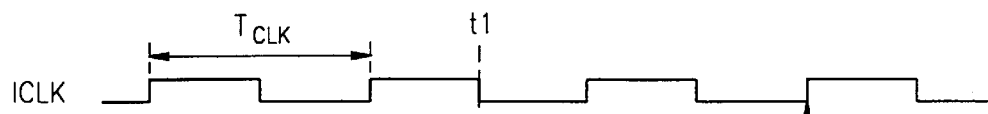
FIGS. 4A through 4D are timing diagrams of respective signals in the circuit of FIG. 2.
Figure 4B:
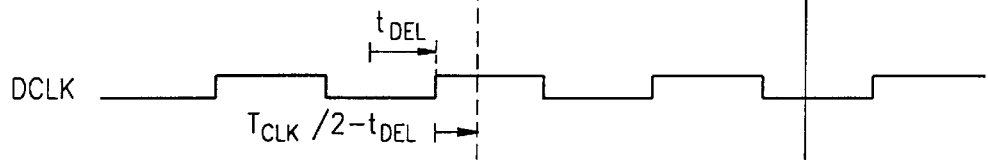
Figure 4C:
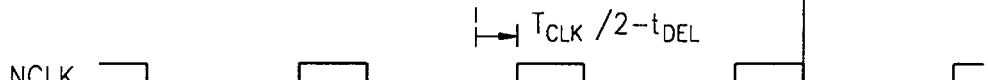
Figure 4D:
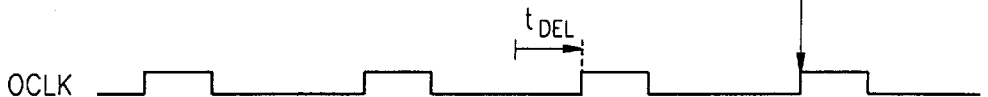
Figure 5:
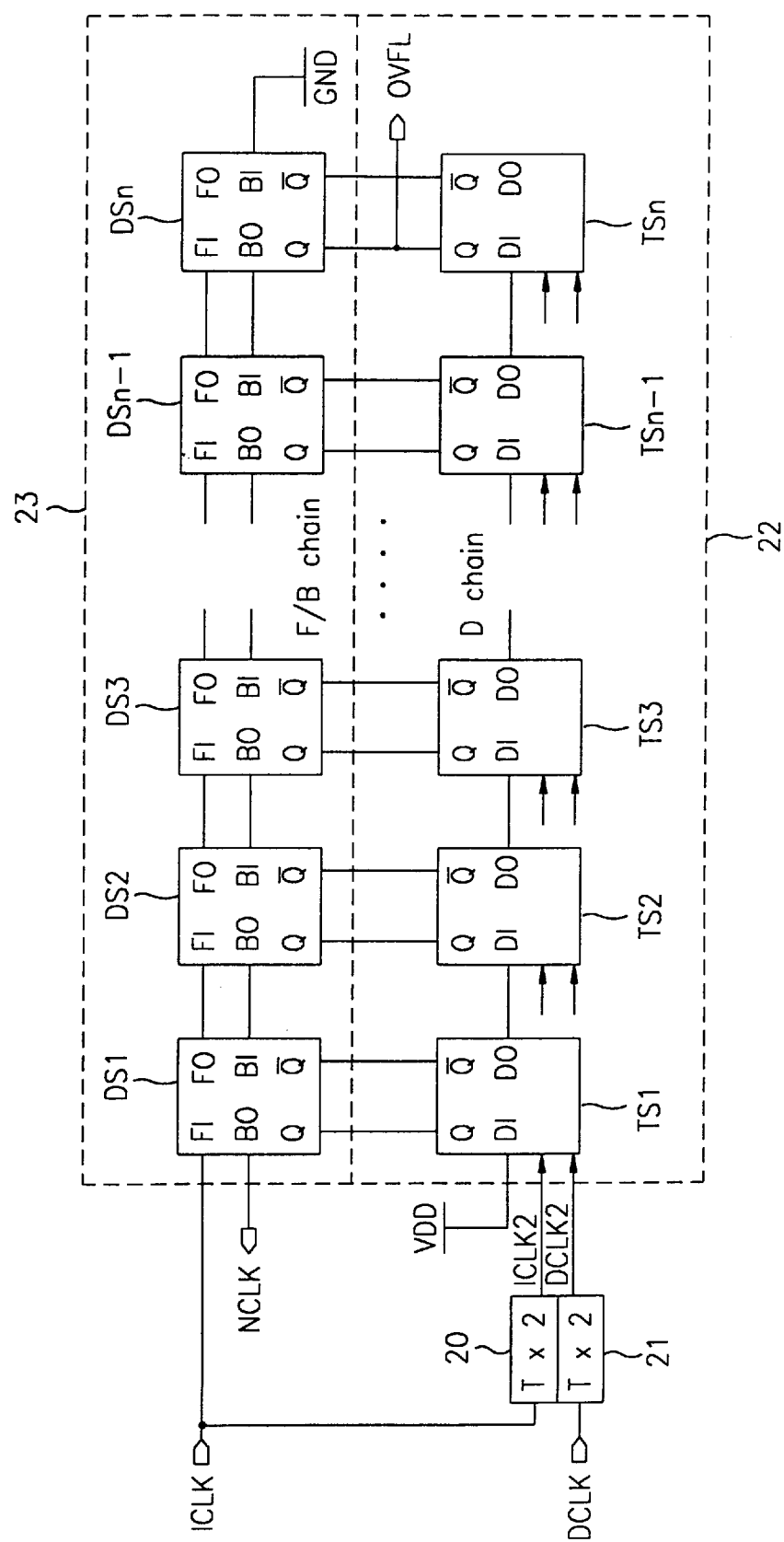
FIG. 5 is a circuit view illustrating a delay time compensation circuit for a clock buffer according to the present invention.

As shown in FIG. 5, the delay time compensation circuit for a clock buffer according to the present invention includes toggle flip-flops 20, 21 which change the frequency of an input clock signal ICLK and a delay clock signal DCLK by a factor of ½. As such, the period and duty cycle of those clock signals may be effectively expanded, enabling the use of clock buffers having increased delay times.

A time interval extraction chain 22 is composed of a plurality of time interval extraction cells TS1~TSn. The time interval extraction chain extracts a time interval ranging from a rising edge of the input clock signal ICLK to a rising edge of the delay clock signal DCLK. A variable delay chain 23 is composed of a plurality of variable delay time cells DS1~DSn. The variable delay chain 23 delays the input clock signal ICLK by the time interval extracted from the time interval extraction chain 22.

Figure 6:
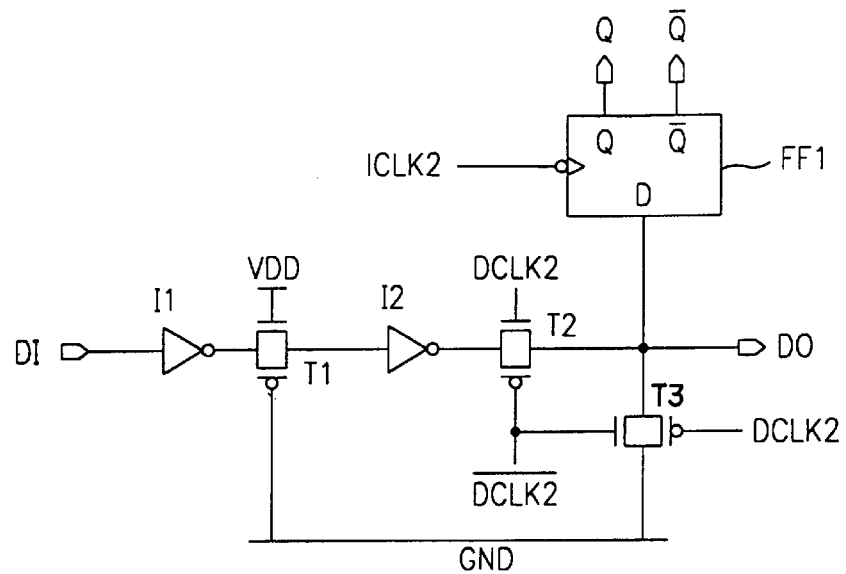
FIG. 6 is a circuit diagram detailing a time interval extraction cell in the circuit of FIG. 5.

As shown in FIG. 6, between an input terminal DI and an output terminal DO of each of the time interval extraction cells TS1~TSn is an inverter I1, an transmission gate T1, an inverter I2 and an transmission gate T2, connected in series. These components equalize the delay time of the variable delay time cells DS1~DSn. Between the output terminal DO and a ground voltage, a transmission gate T3 is connected to reset the output. A data flip-flop FF1 samples an output value DO at a falling edge of a clock signal ICLK2, and outputs the sampled value to the variable delay chain 23.

Figure 7:
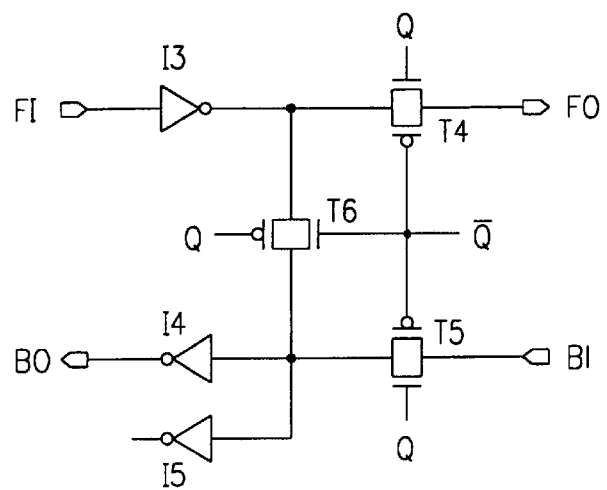
FIG. 7 is a circuit diagram detailing a variable delay time cell in the circuit of FIG. 5.

As shown in FIG. 7, each of the plurality of variable delay time cells DS1~DSn include an inverter I3 and a transmission gate T4 sequentially connected between a first input terminal FI and a first output terminal FO. A transmission gate T5 and an inverter I4 are connected between a second input terminal BI and a second output terminal BO in a reverse order. A transmission gate T6 is positioned between the first input terminal FI and the second output terminal BO. Each of terminals T4, T5 and T6 receive inputs Q and $\overline{Q}$ based on the samples of output value DO from a corresponding time internal extraction cell. An inverter I5 provides an additional load to control the delay time of the signal. By connecting the inverter I5, the load of the signal processing direction (FI→F0) of the variable delay chain 23 is made identical with the load of the signal processing direction (DI→DO) of the time interval extraction cell 22, and thus the delay time of signal processing direction (FI→FO) is made identical with the delay time of signal processing direction (DI→DO) with regard to the proceeding direction of a signal.

The operation of the above-described delay time compensation circuit for a clock buffer will now be explained.

Figure 8A:
FIGS. 8A through 8F are timing diagrams of respective signals in the circuit of FIG. 5.
Figure 8B:
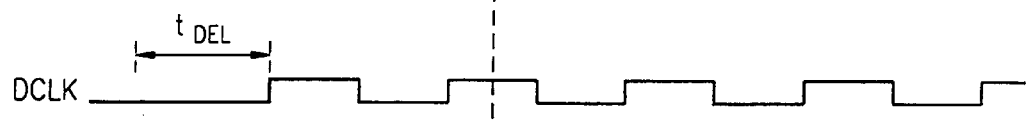
Figure 8C:
Figure 8D:
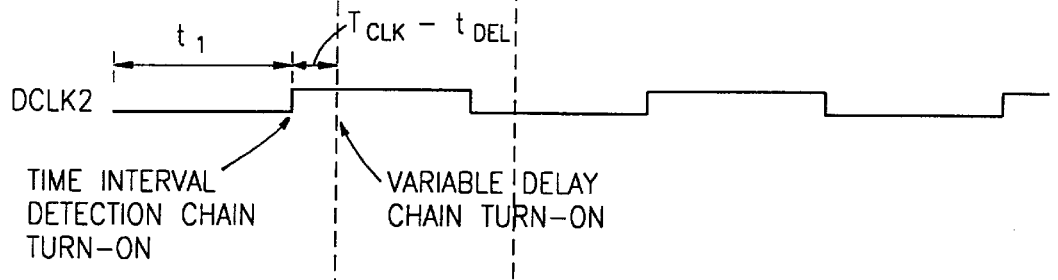

The input clock signal ICLK (FIG. 8A) is delayed by $t_{DEL}$ in a clock buffer (not shown), thereby producing delayed clock signal DCLK (FIG. 8B). The toggle flip-flops 20, 21 multiply the frequency of the input clock signal ICLK and the delay clock signal DCLK by a factor of ½, thereby outputting clock signals ICLK2, DCLK2 as shown in FIGS. 8C, 8D. Here, an interval $t_{DEL}$ between rising edges of the two multiplied clock signals remains unchanged.

The output DO of the time interval extraction cells TS1~TSn is reset to "0" in the interval t1 during which the multiplied delay clock signal DCLK2 has a level of "0".

Accordingly, there is prepared a time interval extraction operation. Then, when the clock signal DCLK2 changes to a level of "1", the time interval extraction chain 22, including inverters I1, I2 and transmission gates T1, T2 of the time interval extraction cell, operates as a delay device, whereby the output DO of the respective cells begin changing to a level of "1" starting from first group TS1.

That is, the specific embodiment shown in FIG. 6 operates as follows: When the multiplied delayed clock signal DCLK2 has a level of "0", transmission gate T2 is turned off and transmission gate T3 is turned on, effectively grounding output DO. By contrast, when the multiplied delayed clock signal DCLK2 has a high level of "1", transmission gate T2 is turned on and transmission gate T3 is turned off, so that input DI is passed to output DO.

While the output DO of the respective time interval extraction cells TS1~TSn remains "1", the data flip-flop FF1 becomes triggered at a point where the clock signal ICLK2 changes to a level of "0", at which time the value of the output DO of the respective time interval extraction cells TS1~TSn is sampled.

At this time, assuming that an output DO of the respective time interval extraction cells TS1~TSn has a level of "1" in a range from the first group TS1 to the $J^{th}$ group TSj, the output Q of the data flip-flop FF1 ranging from the first group to the $J^{th}$ group becomes "1". Assuming the output DO of the j+1th time interval extraction cell has a level of "0", the output Q of the data flip-flop FF1 corresponding to a $J+1^{th}$ group $Ts_{j+1}$ becomes "0".

As a result, if the value of $T_{CLK}-t_{DEL}$ is expressed spacially according to respective locations of the groups, Qi (i varies from 1 to J) becomes "1", and Qi (i varies from J to n) becomes "0". If the value of $T_{CLK}-t_{DEL}$ is expressed in terms of a delay time of the respective time interval extraction cells TS1~TSn, it becomes $J \times t_{stage}$, wherein $t_{stage}$ is a delay time according to two inverters I1, I2 and two transmission gates T1, T2.

When an output value Q produced by the data flip-flop FF1 is applied, the delay operation of the input clock signal ICLK is carried out via the variable delay chain 23. Here, if the output Q of the data flip-flop FF1 is "1", the delay operation is carried out in a forward direction (FI→FO) and in a reverse direction (BI→BO). By contrast, the output Q is "0", the forward direction input becomes shunted to a reverse direction, whereby there occurs an output of a reverse direction (FI→T6→BO).

That is, because the output Q of the data flip-flop FF1 from first group to Jth group in the time interval extraction cells TS1~TSn is "1", the input clock signal ICLK proceeds in a forward direction from the first group to the $J^{th}$ group. Since the output Q after J+$1^{th}$ group is "0", the transmission gate T6 in the J+$1^{th}$ group becomes turned on, causing the input clock signal ICLK to proceed in a reverse direction from the $J^{th}$ group to first group.

Thus, the delay time associated with a $J^{th}$ group procession in respective directions is J (a summed delay time of the inverter and the transmission gate), if the input clock signal ICLK proceeds from 1 to J and reversely proceeds from J to 1. Furthermore, the delay time of the input clock signal ICLK becomes 2×J×(a summed delay time of the inverter and the transmission gate).

Figure 8E:
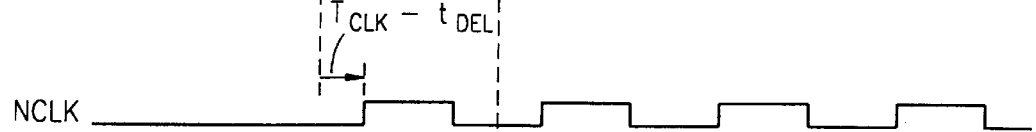

The delay time is identical to a value of $J \times t_{stage}$, which is obtained from the time interval extraction chain 22. The value of $J \times t_{stage}$ is identical to a value of $T_{CLK}-t_{DEL}$ (shown in FIG. 8E), which is obtained from the time interval extraction chain 22, so that the input clock signal ICLK is used to generate a clock signal NCLK (shown in FIG. 8E), which is delayed by $T_{CLK}-t_{DEL}$ at a falling edge of the clock signal ICLK2.

Figure 8F:

At this time, since the rising edge of the clock signal NCLK remains ahead of the rising edge of the input clock signal ICLK by $t_{DEL}$, the final clock signal OCLK (shown in FIG. 8F), becomes synchronized to the input clock signal ICLK if the clock signal NCLK is passed through the output buffer having the delay time of $t_{DEL}$.

Also, if a value obtained by multiplying a number N of cells by delay time $t_{stage}$ corresponding to each of the respective cells in the time interval extraction chain 22 is larger than the entire cycle of the clock signal, the delay time $t_{DEL}$ of the clock buffer being compensated by the circuit according to the present invention is incorporated into expression (3):

$$0 \leq t_{DEL} \leq T_{CLK} \qquad (3).$$

As evident from expression (3), the delay time $t_{DEL}$ which can be compensated by the present invention is twice the delay time which can be compensated by the conventional NDC. In fact, it should be understood that the range of delay times that can be compensated is expanded to the entire cycle of the input clock signal ICLK.

The delay time compensation circuit for a clock buffer according to the present invention delays the input clock signal ICLK in a simple mode and obtains the final clock signal OCLK such that the input and clock signals remain identical, thereby resolving the conventional problem in which the pulse width of the output clock signal NCLK in the conventional NDC becomes variable depending on the delay time of a buffer.

In addition, the time interval extraction chain according to the present invention determines an interval of time interval between respective edges of the two input clock signals ICLK2, DCLK2, and the extracted value is spatially stored in the data flip-flop in the respective groups and employed, and also there may be adopted a variety of circuits such as NDC and DLL employing a time interval between clock signals.

As described above, the delay time compensation circuit for a clock buffer according to the present invention employs the time interval extraction chain and the variable delay time chain to promptly compensate for the time delayed by the clock buffer, thereby obtaining a synchronization after two cycles of the input clock signal.

Further, the delay time compensation circuit for a clock buffer according to the present invention employs a ½-frequency multiplied clock signal and operates to determine and compensate for delay, regardless of the duty cycle of an input clock signal, thereby compensating for all the delay time within the cycle of the input clock signal.

Still further, because a feedback technique is not employed, synchronization with regard to the clock signal may be obtained rapidly. An initial synchronous time is also reduced relative to the conventional DLL by storing time interval data with regard to randomly selected two clock signals in the time interval extraction chain.

While there have been illustrated and described what are at present considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation or material to the teaching of the present invention without departing from the central scope thereof. Therefor, it is intended that the present invention not be limited to the particular embodiment disclosed as the best mode contemplated for carrying out the present invention, but that the present invention includes all embodiments falling within the scope of the appended claims.

The foregoing description and the drawings are regarded as including a variety of individually inventive concepts, some of which may lie partially or wholly outside the scope of some or all of the following claims. The fact that the applicant has chosen at the time of filing of the present application to restrict the claimed scope of protection in accordance with the following claims is not to be taken as a disclaimer of alternative inventive concepts that are included in the contents of the application and could be defined by claims differing in scope from the following claims, which different claims may be adopted subsequently during prosecution, for example, for the purposes of a continuation or divisional application.

What is claimed is:

1. A delay time compensation circuit for a clock buffer, comprising:
    first and second toggle flip-flops generating a multiplied input clock signal and a multiplied delayed clock signal by multiplying an input clock signal and a delayed clock signal, respectively, where the input clock signal is delayed by an input buffer to generate the delayed clock signal;
    a time interval extraction chain determining a first time interval between a rising edge of the input clock signal and a rising edge of the delayed clock signal, the time interval being determined based on the multiplied input clock signal and the multiplied delayed clock signal; and
    a variable delay chain delaying the input clock signal by a second time interval that is based on the first interval determined by the time interval extraction chain.

2. The circuit of claim 1, wherein a period of the multiplied input clock signal is greater than a period of the input clock signal, and wherein a period of the multiplied delayed clock signal is greater than a period of the delayed clock signal.

3. The circuit of claim 1, wherein the time interval extraction chain comprises a plurality of time interval extraction cells.

4. The circuit of claim 1, wherein the variable delay chain comprises a plurality of variable delay time cells.

5. The circuit of claim 3, wherein each of the plurality of time interval extraction cells comprises:
    a first inverter, a first transmission gate, a second inverter and a second transmission gate which are serially connected between an input terminal and an output terminal;
    a third transmission gate connected between the output terminal and a ground voltage; and
    a data flip-flop connected to the output terminal, the data flip-flop sampling the output value at the output terminal when a falling edge of the multiplied input signal is output by the first toggle flip-flop.

6. The circuit of claim 4, wherein each of the plurality of variable delay time cells comprises:
    a first inverter and a first transmission gate which are sequentially connected in a forward direction between a first input terminal and a first output terminal;
    a second transmission gate and a second inverter which are sequentially connected in a reverse direction between a second input terminal and a second output terminal; and
    a third transmission gate shunting the two proceeding directions.

7. The circuit of claim 6, wherein the first and second transmission gates are turned on in accordance with a first output of the data flip-flop, and the third transmission gate is turned on in accordance with a second output of the data flip-flop, where the first and second outputs of the data flip-flop are inverted.

8. The delay time compensation circuit of claim 1, wherein a pulse width of the signal generated by the variable delay chain is based on a pulse width of the input clock signal.

9. A delay time compensation circuit for a clock buffer, comprising:
    a time interval extraction chain for determining a first time interval between a rising edge of an input clock signal and a rising edge of a delayed clock signal; and
    a variable delay chain delaying the input clock signal by a second time interval that is based on the first time interval determined by the time interval extraction chain, without performing a feedback operation.

10. A delay time compensation circuit for a clock buffer, comprising:
    a multiplier generating a multiplied input clock signal and a multiplied delayed clock signal; and
    a clock generator generating a clock signal based on the multiplied input clock signal and the multiplied delayed clock signal; wherein
        said multiplier input clock signal is synchronized with said multiplier delayed clock signal based upon rising edges of said multiplier clock signals, without performing a feedback operation.

11. The delay time compensation circuit of claim 10, further comprising:
    means for determining differences between the multiplied input clock signal and the multiplied delayed clock signal, wherein the clock signal is generated based on the differences determined.

12. The delay time compensation circuit of claim 10, wherein a pulse width of the clock signal generated by the clock generator is based on a pulse width of the input clock signal.

13. The circuit of claim 1, wherein the first and second toggle flip-flops multiply a frequency of the input signal and delay signal by half.

14. A method, of compensating a delay time for a clock buffer, comprising:
    generating a multiplied input clock signal and a multiplied delayed clock signal by multiplying an input clock signal and a delayed clock signal, respectively, where the input clock signal is delayed to generate the delayed clock signal;
    determining a first time interval between a rising edge of the input clock signal and a rising edge of the delayed clock signal, the time interval being determined based on the multiplied input clock signal and the multiplied delayed clock signal; and
    delaying the input clock signal by a second time interval that is based on the first interval.

15. A method, of compensating a delay time for a clock buffer, comprising:
    determining a first time interval between a rising edge of an input clock signal and a rising edge of a delayed clock signal; and
    delaying the input clock signal by a second time interval that is based on the first time interval, without performing a feedback operation.

16. A method, of compensating a delay time for a clock buffer, comprising:

generating a multiplied input clock signal and a multiplied delayed clock signal; and generating a clock signal based on the multiplied input clock signal and the multiplied delayed clock signal; wherein said multiplied input clock signal is synchronized with said multiplied delayed clock signal based upon rising edges of said multiplied clock signals, without performing a feedback operation.

17. A method, of compensating delay time for a clock buffer, comprising:

detecting input clock signal without using a falling edge thereof;

detecting a delayed input clock signal without using a falling edge thereof; and synchronizing said input clock signal with said delayed input clock signal, without performing a feedback operation, to obtain an output clock signal.

* * * * *